United States Patent
Goshima et al.

(10) Patent No.: US 8,427,919 B2
(45) Date of Patent: Apr. 23, 2013

(54) PATTERN WRITING SYSTEM AND METHOD AND ABNORMALITY DIAGNOSING METHOD

(75) Inventors: Yoshikuni Goshima, Shizuoka (JP); Akira Noma, Kanagawa (JP)

(73) Assignee: NuFlare Technology, Inc., Numazu-shi (JP)

(*) Notice: Subject to any disclaimer, the term of this patent is extended or adjusted under 35 U.S.C. 154(b) by 0 days.

(21) Appl. No.: 13/084,870

(22) Filed: Apr. 12, 2011

(65) Prior Publication Data

US 2011/0255388 A1    Oct. 20, 2011

(30) Foreign Application Priority Data

Apr. 14, 2010  (JP) .................................. 2010-093471

(51) Int. Cl.
*G11B 7/00* (2006.01)
(52) U.S. Cl.
USPC ....................... 369/53.27; 369/101
(58) Field of Classification Search .... 369/53.12–53.16, 369/53.26, 53.27, 53.31, 53.42, 101, 116, 369/47.5, 100; 356/337, 338, 341, 448; 250/492.2–492.3, 396 R, 397
See application file for complete search history.

(56) References Cited

U.S. PATENT DOCUMENTS

| | | | |
|---|---|---|---|
| 4,937,458 A * | 6/1990 | Fujikura | 250/397 |
| 5,614,713 A * | 3/1997 | Kobaru et al. | 250/310 |
| 5,808,313 A | 9/1998 | Yamada et al. | |
| 6,225,637 B1 * | 5/2001 | Terashima et al. | 250/492.2 |
| 2003/0010936 A1 * | 1/2003 | Udagawa et al. | 250/492.21 |
| 2003/0206027 A1 * | 11/2003 | Nozoe et al. | 324/751 |
| 2006/0290923 A1 * | 12/2006 | Nakano et al. | 356/237.3 |
| 2007/0187599 A1 * | 8/2007 | Abe et al. | 250/310 |
| 2008/0093562 A1 * | 4/2008 | Kasono et al. | 250/396 R |
| 2008/0107329 A1 * | 5/2008 | Kim et al. | 382/149 |
| 2009/0091750 A1 * | 4/2009 | Urano et al. | 356/237.3 |

FOREIGN PATENT DOCUMENTS

| | | |
|---|---|---|
| JP | 3-24772 | 4/1991 |
| JP | 3-24772 B2 | 4/1991 |
| JP | 5-74404 A | 3/1993 |

OTHER PUBLICATIONS

Office Action issued Aug. 7, 2012 in Korean Application No. 10-2011-33990 (English translation).

* cited by examiner

*Primary Examiner* — Thang Tran
(74) *Attorney, Agent, or Firm* — Oblon, Spivak, McClelland, Maier & Neustadt, L.L.P.

(57) ABSTRACT

Reflected and scattered electrons generated by emitting an electron beam onto a substrate are detected by a detecting unit. The product of the area ($S_N$) and the irradiation time ($t_N$) of the Nth shot in a predetermined measurement unit obtained from writing data is computed by a computing unit. The value obtained by accumulating an instructed equivalent value in the predetermined measurement unit and the value obtained by integrating the signal ($D_N$) from the detecting unit in the predetermined measurement unit are compared and determined by a comparing unit to determine whether or not abnormality occurs in the irradiation amount of the electron beam.

4 Claims, 10 Drawing Sheets

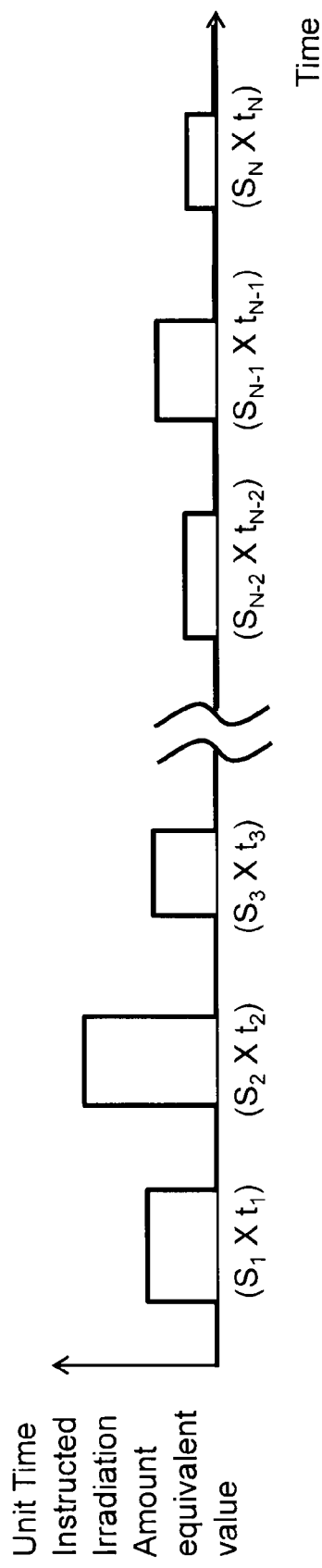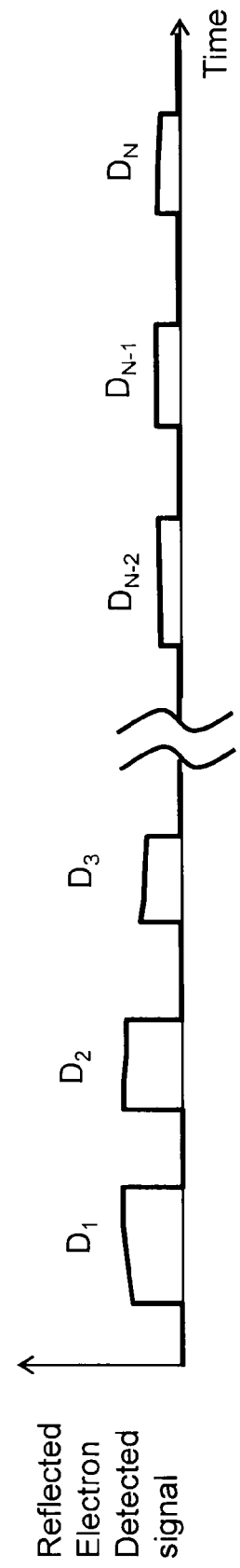
Fig. 7A
Unit Time Instructed Irradiation Amount equivalent value
Fig. 7B
Reflected Electron Detected signal

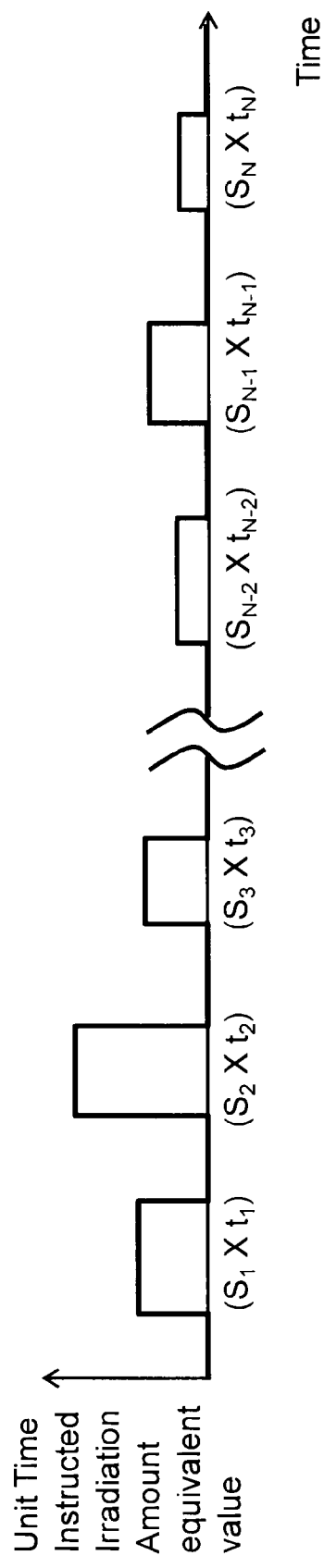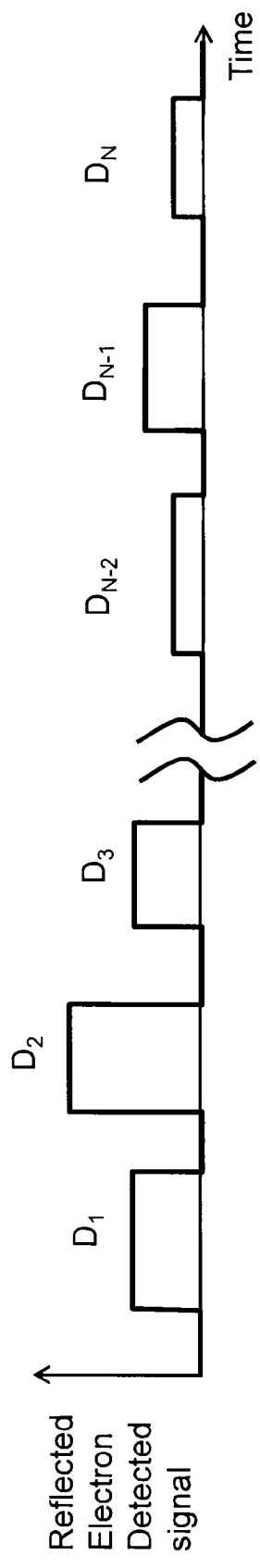

PATTERN WRITING SYSTEM AND METHOD AND ABNORMALITY DIAGNOSING METHOD

CROSS-REFERENCE TO RELATED APPLICATION

The entire disclosure of the Japanese Patent Application No. 2010-093471, filed on Apr. 14, 2010 including specification, claims, drawings and summary, on which the Convention priority of the present application is based, are incorporated herein in its entirety.

BACKGROUND OF THE INVENTION

1. Field of the Invention

The present invention relates to a pattern writing system, a pattern writing method, and an abnormality diagnosing method of the pattern writing system.

2. Background Art

Photomasks (also called reticles or masks, hereinafter referred to collectively as masks) for forming fine element circuit patterns of semiconductor integrated circuits (LSIs) or the like are manufactured by irradiating and exposing resists coated onto mask substrates with beams such as electron beams or laser beams, followed by development and etching. In addition, some semiconductor devices are manufactured by directly performing writing of circuit patterns onto semiconductor wafers with the beams.

In pattern writing systems using an energy beam, when abnormality of the writing position and an amount of irradiation caused by the pattern writing system or caused by an abnormality due to foreign substances on the substrate occurs, the abnormality is usually found in the inspection process of the written patterns. The pattern writing process may take 10 hours or more, during which time the writing is continued regardless of the occurrence of an abnormality. In addition, the inspection process is performed after the pattern forming process, including, not only the writing process, but also the developing process thereafter. Therefore, discovery of an abnormality or plurality of abnormalities after such process leads to significant waste of time and cost. In other words, if the same kind of abnormality occurs on all the substrates and the products written between the occurrence and discovery of the abnormality do not satisfy the shipping specifications, the writing time has been wasted. In addition, the continuation of the writing means delay in start of diagnosing of the abnormality, fixing and the recovery of the writing system. Further, when the product is used in the next process without detecting the abnormality in the inspection process, secondary damage in the wafer process, for example, may occur. For these reasons, abnormality is desired to be detected during the writing process.

For addressing this problem, a method for detecting abnormality of each shot during the writing process in a charged particle beam pattern writing system is disclosed. See for example, Japanese Patent Application Publication No. 3-24772 and Japanese Patent Application Laid-Open No. 5-74404).

Japanese Patent Application Publication No. 3-24772 discloses a charged particle beam exposure system in which an electron lens is arranged at a fixed angle from the main beam axis near an exposed material surface, reflected charged particles from the irradiated material surface are focused by the electron lens on a two-dimensional position detector. The output signal of the position detector and the pattern signal transmitted to a deflector are compared to detect abnormality of the exposing position.

In this publication, a method for detecting irradiation amount abnormality is also disclosed. The method includes detecting a total current of the position detector for a shot, calculating the shot area and the shot time from the electric signals to the shaping deflectors and the blanking deflectors to form the shot and comparing them.

In Japanese Patent Application Publication No. 3-24772, the signal from the position detector and the signals for irradiation amount are processed and compared shot by shot.

However, the detection of reflected electrons for every shot by each shot and processing corresponding electrical signals make the data amount enormous and the processing load is heavy. In particular, recently, while patterns for LSI have become more complicated increased in the pattern density, and the shot time per shot has been shortened. It is more difficult to realize the method of abnormality detection during writing for recent LSI patterns.

The present invention has been conceived in view of such problems. In other words, an object of the present invention is to provide a pattern writing system and a pattern writing method, which efficiently detects and treats an irradiation amount abnormality during pattern writing in real time. Further, an object of the present invention is to provide an abnormality diagnosing method including estimating the cause of the abnormality.

Other challenges and advantages of the present invention are apparent from the following description.

SUMMARY OF THE INVENTION

In accordance of an aspect of the present invention, a pattern writing system which emits an energy beam onto a substrate to write a pattern based on writing data onto the substrate, includes a detecting unit which detects reflected and scattered charged particles or reflected and scattered light generated by emitting the energy beam onto the substrate; a computing unit which computes a first value, the first value being an equivalent value of an instructed irradiation amount in a predetermined measurement unit, using the writing data; an integrating unit which integrates a signal from the detecting unit in the predetermined measurement unit to obtain a second value; and a comparing unit which compares the first value from the computing unit with the second value from the integrating unit.

In another aspect of this invention, a pattern writing system which emits an energy beam onto a substrate to write a predetermined pattern based on writing data onto the substrate, includes a detecting unit which detects reflected and scattered charged particles or reflected and scattered light generated by emitting the energy beam onto the substrate; a computing unit which computes a first value, the first value being an equivalent value of an instructed irradiation amount in a predetermined measurement unit, using the writing data; an integrating unit which integrates a signal from the detecting unit in the predetermined measurement unit to obtain a second value; a comparing unit which compares the first value from the computing unit with the second value from the integrating unit.

In another aspect of this invention, a pattern writing method of a pattern writing system which emits an energy beam onto a substrate to write a pattern based on writing data onto the substrate, including the steps of detecting reflected and scattered charged particles or reflected and scattered light generated by emitting the energy beam onto the substrate;

computing a first value, the first value being an equivalent value of instructed irradiation amount in a predetermined measurement unit, using the writing data; integrating a signal from the detecting step in the predetermined measurement unit to obtain a second value; and comparing the first value obtained in the computing step with the second value obtained in the integrating step to determine abnormality, wherein, when it is determined that abnormality occurs in the comparing step, information in the comparing step is accumulated to perform a predetermined process.

In another aspect of this invention, an abnormality diagnosing method of a pattern writing system which emits an energy beam onto a substrate to write a predetermined pattern using writing data onto the substrate, including the steps of: detecting reflected and scattered charged particles or reflected and scattered light generated by emitting the energy beam onto the substrate; computing a first value, the first value being an equivalent value of an instructed irradiation amount in a predetermined measurement unit, using the writing data; integrating a signal obtained from the detecting step in the predetermined measurement unit to obtain a second value; comparing the first value from the computing step with the second value from the integrating step; storing time series data of shot irradiation to a first storing unit, a shot irradiation being equivalent to the instructing irradiation amount for each shot calculated using the writing data; and storing a time series signal from the detecting unit to a second storing unit, wherein, when it is determined that abnormality occurs in the comparing step, the time series data of shot irradiation in the first storing unit and the time series signal in the second storing unit are compared to estimate the cause of the abnormality.

DESCRIPTION OF DRAWINGS

FIG. 7A schematically shows an equivalent value of instructed irradiation amounts.

FIG. 7B schematically shows the reflected electron amounts detected by the detecting unit.

FIG. 9A schematically shows an equivalent value of instructed irradiation amounts.

FIG. 9B schematically shows the reflected electron amounts detected by the detecting unit.

DETAILED DESCRIPTION OF THE EMBODIMENTS

First Embodiment

Figure 1:
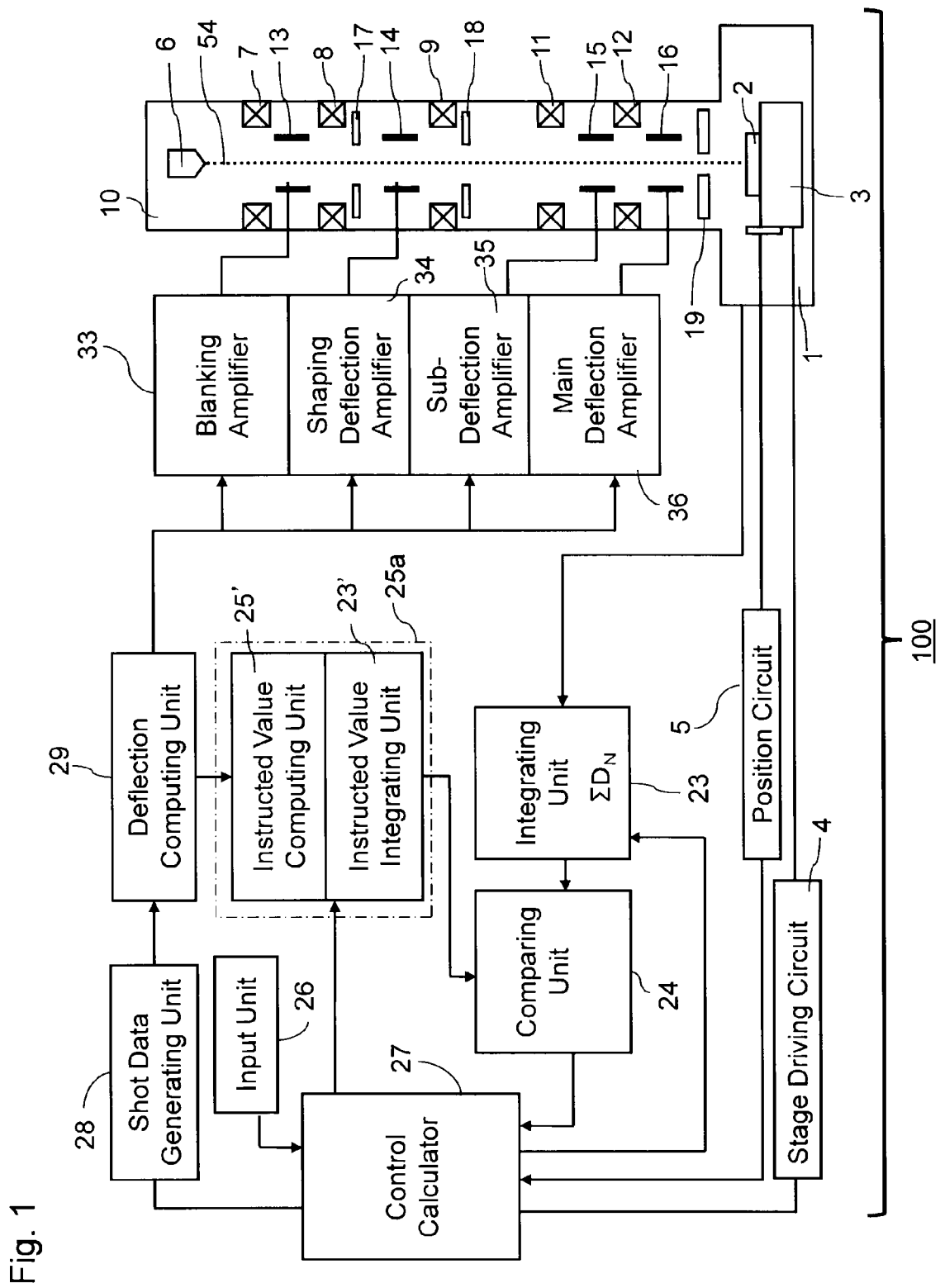
FIG. 1 is a block diagram of an electron beam writing system of a variable shaped beam (VSB) type

FIG. 1 is a block diagram of an electron beam writing system of a variable shaped beam (VSB) type, which is one of representative energy beam writing systems according to this embodiment. An electron beam writing system 100 has a detecting unit 19 which detects reflected and scattered electrons generated by emitting an electron beam onto a substrate, a computing unit 25a which determines an irradiation amount equivalent value in a predetermined measurement unit obtained from writing data, an integrating unit 23 which integrates the signal from the detecting unit in the predetermined measurement unit, and a comparing unit 24 which compares the value obtained by the computing unit 25a with the value obtained by the integrating unit 23.

The electron beam writing system 100 is a system for performing writing to form a desired pattern by emitting an electron beam 54 onto the surface of a substrate 2. For this reason, the electron beam writing system 100 has a writing chamber 1, and an electron optical lens-barrel 10, which is an electron beam irradiation means and is erected in the upper portion of the writing chamber 1. The writing chamber 1 has an XY stage 3 which can be moved in an X direction and a Y direction perpendicular to the optical axis direction of the electron beam 54. The electron optical lens-barrel 10 shapes the electron beam 54 emitted from an electron gun 6 into a variable shape, and deflects and irradiates the beam onto the substrate 2. As shown in FIG. 1, the configuration has the electron gun 6, various lenses 7, 8, 9, 11, and 12, a blanking deflector 13, a shaping deflector 14, a sub-deflector 15, a main deflector 16, and two beam shaping apertures 17 and 18.

The substrate 2 can be, for example, a substrate for a photomask and a reticle or a wafer.

The detecting unit 19 is provided above the writing chamber 1, and detects, as a current value, reflected and scattered electrons generated by irradiating the electron beam 54 onto the substrate 2. The detecting unit 19 may detect, as a current value, secondary electrons in addition to the reflected and scattered electrons. In addition, the detecting unit 19 may detect other charged particles such as ions.

The electric signal ($D_N$) output from the detecting unit 19, that is, the electric signal detected from the reflected and scattered electrons caused by the Nth shot, in the predetermined measurement unit, is integrated in the predetermined measurement unit to transmit the integrated value ($\Sigma D_N$) to the comparing unit 24. Although the integrating method will be described later, it can also be performed by accumulating the detection signal (current value) in the predetermined measurement unit.

The comparing unit 24 compares the integrated value from the detecting unit 19 with the accumulated value of the irradiation amount equivalent value from the computing unit 25a in the predetermined measurement unit. Here, the computing unit 25a has an instructed value computing unit 25' which determines the irradiation amount equivalent value ($S_N \times t_N$), that is, an equivalent value of instructed irradiation amount by the Nth shot, and a value integrating unit 23' which calculates the accumulated value in the predetermined measurement unit. The irradiation amount equivalent value ($S_N \times t_N$) is a reference value used to determine whether or not irradiation amount abnormality occurs in the electron beam writing system 100, and corresponds to the right irradiation amount for writing the shot. An equivalent value of instructed irradiation amount ($S_N \times t_N$) is specifically calculated as follows.

Writing data is created by subjecting design data (CAD data) of a semiconductor integrated circuit to correction for writing and figure pattern division processes.

When the writing data stored in a magnetic disc (not shown) is read from an input unit 26 by a control calculator 27, a shot data generating unit 28 generates the figure code (K), the position coordinates, the size (L1, L2), and the irradiation time (t) of each shot. Here, the irradiation time of the Nth shot in the predetermined measurement unit is represented by $t_N$, and the figure code is represented by $K_N$.

Next, the shot size (L1, L2) and the position coordinates are transmitted from the shot data generating unit 28 to a deflection computing unit 29 to perform correction computation and settling time calculation. Here, L1 is the shot size in the X direction, and L2 is the shot size in the Y direction.

The settling time is time necessary for settling the deflection voltage by of the deflection amplifiers (34, 35).

The instructed value computing unit 25' calculates an equivalent value of instructed irradiation amount from L1 and L2, the irradiation time t, and the figure code K after correction computation received from the deflection computing unit 29. For example, denoting Nth shot area in the predetermined measurement unit as $S_N$, $S_N$ for the rectangular shot is calculated by $S_N = (L1 \times L2)$. $S_N$ for the triangular shot is calculated by $S_N = \{(L1 \times L2)/2\}$. In this embodiment, the shot area $S_N$ is multiplied by the irradiation time $t_N$ and the current density D. The current density D is constant, and $S_N \times t_N$ is considered as an equivalent value of instructed irradiation amount.

An equivalent value of instructed irradiation amount ($S_N \times t_N$) calculated as above is accumulated and integrated by the instructed value integrating unit 23' in the predetermined measurement unit, and the obtained data ($\Sigma(S_N \times t_N)$) is transmitted to the comparing unit 24.

The comparing unit 24 compares the signal ($\Sigma D_N$) from the integrating unit 23 with the data ($\Sigma(S_N \times t_N)$) from the instructed value integrating unit 23'. Here, the signal ($D_N$) detected by the detecting unit 19 is influenced by the electron reflection and scattering efficiency. Therefore, in consideration of such influence, the following equation represents the relation between these signals.

$$\Sigma(S_N \times t_N) = \alpha \Sigma D_N (\alpha: \text{proportional coefficient})$$

However, this relation breaks when irradiation amount abnormality occurs due to some causes. Therefore, the signal ($\Sigma D_N$) from the integrating unit 23 and the data ($\Sigma(S_N \times t_N)$) from the instructed value integrating unit 23' are compared so as to determine whether or not irradiation amount abnormality occurs.

In addition, when foreign substances such as particles are existing on the substrate, the reflected and scattered electron amount detected by the detecting unit 19 is not the normal value. Further, when the electron beam is irradiated onto the location where foreign substances are exiting, the electron beam cannot be normally irradiated onto the resist film, with the result that the resist pattern cannot be normally formed, leading to writing abnormality. According to the method of this embodiment, such writing abnormality due to foreign substances on the substrate can also be detected.

Further, other equations can also be used for the determination in the comparing unit 24. In the above explanation, when $\Sigma(S_N \times t_N)$ and $\alpha \Sigma D_N$ are equal with each other, the writing in the predetermined measurement unit is normal without abnormality, for simplify the explanation. It is more practical that when the difference between both is within a predetermined range, it is determined normal and abnormality is not occurring.

Second Embodiment

Figure 2:
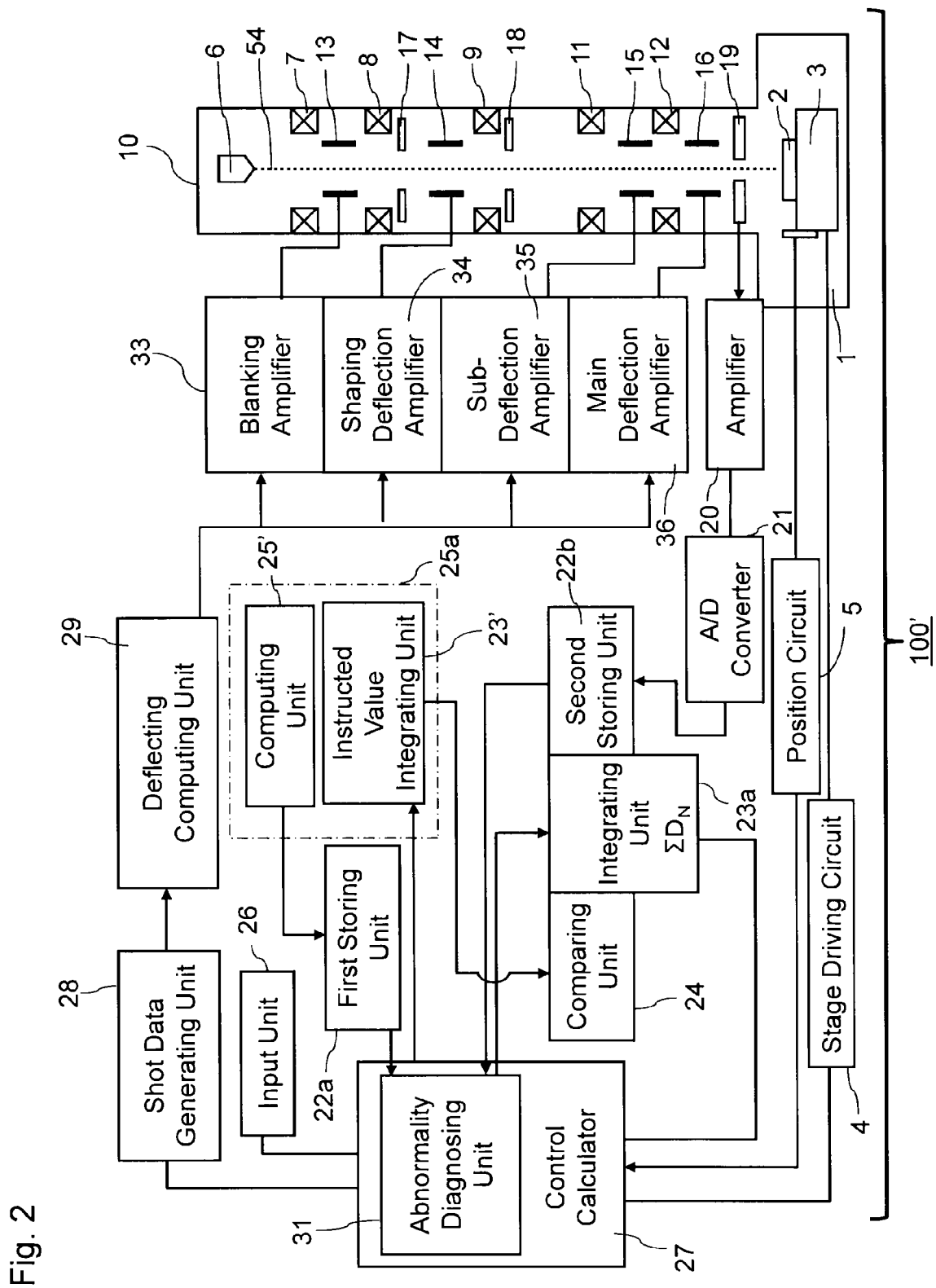
FIG. 2 is a block diagram of an electron beam writing system according to this embodiment.

FIG. 2 is a block diagram of an electron beam writing system according to this embodiment. Further, the same portions as FIG. 1 are indicated by similar reference numerals.

An electron beam writing system 100' has a detecting unit 19 which detects reflected and scattered electrons generated by irradiating the electron beam onto a substrate, a computing unit 25a which determines an equivalent value of instructed irradiation amount in a predetermined measurement unit obtained from writing data, an integrating unit 23a which integrates the signal from the detecting unit 19 in the predetermined measurement unit, a comparing unit 24 which compares an equivalent value of instructed irradiation amount obtained by the computing unit 25a with the integrated detected value obtained by the integrating unit 23a in the predetermined measurement unit and performs abnormality determination, a first storing unit 22a which stores, as the time series data of irradiation, an equivalent value of instructed irradiation amount by each shot obtained from the writing data, a second storing unit 22b which stores the time series signal from the detecting unit, and an abnormality diagnosing unit 31 which is configured to compare and diagnose the time series data of an equivalent value of instructed irradiation amount stored in the first storing unit and the time series data detected by the detecting unit and stored in the second storing unit.

The electric signal ($D_N$) output from the detecting unit 19 is amplified by an amplifier 20, and is input to an A/D converter 21. Here, $D_N$ is the reflected and scattered electron detection signal by the Nth shot in the predetermined measurement unit. The A/D converter 21 converts an analog signal from the amplifier 20 to a digital signal. In addition, the signals are detected and recorded including a time axis.

The electron beam writing system 100' has first and second storing units 22a and 22b, an integrating unit 23a, and comparing unit 24.

The first storing unit 22a stores an equivalent value of instructed irradiation amount ($S_N \times t_N$), as the time series data including the time axis with shot start and end.

The digital signal converted by the A/D converter 21 is transmitted to the second storing unit 22b. The second storing unit 22b temporarily records the history of the signal waveform of the signal ($D_N$) from the detecting unit 19 including the time axis. The integrating unit 23a integrates the signal from the second storing unit 22b in the predetermined measurement unit, and transmits the integrated value ($\Sigma D_N$) to the comparing unit 24.

The comparing unit 24 compares the signal from the detecting unit with the equivalent value of instructed irradiation amount from the computing unit for each predetermined measurement unit. Here, the computing unit has an instructed value computing unit 25' which determines an equivalent value of instructed irradiation amount ($S_N \times t_N$), and an instructed value integrating unit 23'. An equivalent value of instructed irradiation amount ($S_N \times t_N$) is a reference value used to determine whether or not irradiation amount abnormality occurs in the electron beam writing system 100, and corresponds to the irradiation amount necessary for writing a shot. An equivalent value of instructed irradiation amount ($S_N \times t_N$) is calculated as in the above embodiment.

The comparing unit 24 compares the signal ($\Sigma D_N$) from the detecting unit with the signal ($\Sigma(S_N \times t_N)$) from the irradiation amount computing unit. Here, the signal ($D_N$) detected by the detecting unit 19 is influenced by the electron reflection and scattering efficiency. Therefore, in consideration of such influence, the following equation represents the relation between these signals.

$$\Sigma(S_N \times t_N) = \alpha \Sigma D_N (\alpha: \text{proportionality coefficient})$$

However, this relation brakes when irradiation amount abnormality occurs due to some causes. Therefore, the signal ($\Sigma D_N$) from the detecting unit and the signal ($\Sigma(S_N \times t_N)$) from the irradiation amount computing unit are compared so as to determine whether or not irradiation amount abnormality occurs.

In addition, when foreign substances such as particles are existing on the substrate, the reflected and scattered electron amount detected by the detecting unit 19 is not the normal value. Further, when the electron beam is irradiated onto the location where foreign substances are existing, the electron beam cannot be normally irradiated onto the resist film, with the result that the resist pattern cannot be normally formed, leading to writing abnormality. According to the method of this embodiment, such writing abnormality due to foreign substances on the substrate can also be detected.

Further, other equations can also be used for the determination in the comparing unit 24. In the above explanation, when $\Sigma(S_N \times t_N)$ and $\alpha \Sigma D_N$ are equal with each other, the writing in the predetermined measurement unit is normal without abnormality, for simplify the explanation. It is more practical that when the difference between both is within a predetermined range, it is determined normal and abnormality is not occurring.

When it is determined that writing abnormality due to the irradiation amount and foreign substances occurs in the comparing unit 24, the information is transmitted to the abnormality diagnosing unit 31 provided in a control calculator 27. Here, the information includes information of the writing position on the substrate (which may be the writing position of the predetermined measurement unit). In addition, the time series data of the signal ($D_N$) and an equivalent value of instructed irradiation amount ($S_N \times t_N$) stored in the first storing unit 22a and the second storing unit 22b are also transmitted to the abnormality diagnosing unit 31. The signal ($D_N$) is a signal history including the time axis. The abnormality diagnosing unit 31 performs diagnosis such as identification of the abnormality location and estimation of abnormality cause. The result is output and notified to the user via the control calculator 27.

Figure 3:
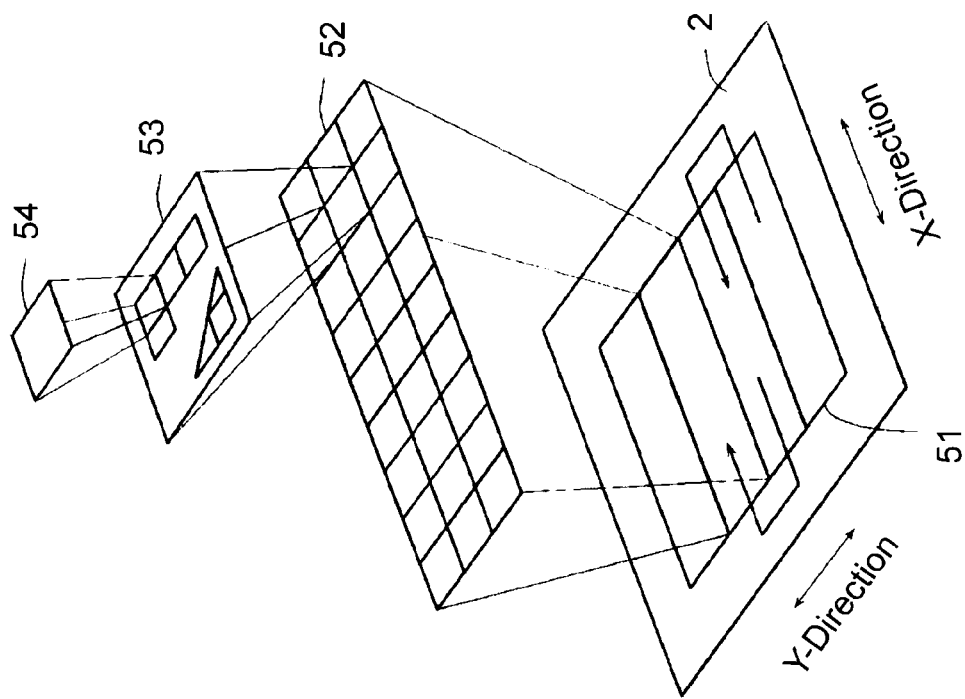
FIG. 3 is an explanatory view of the writing method using an electron beam.

FIG. 3 is an explanatory view of the writing method using the electron beam. As shown in this drawing, a pattern 51 written onto the substrate 2 is divided into rectangular frame regions (main deflection regions) 52. The writing with the electron beam 54 is performed for each of the frame regions 52 while the stage 3 is continuously moving in one direction (e.g., in the X direction). Each of the frame regions 52 is further divided into sub-deflection regions 53. The electron beam 54 writes only the writing portion in the sub-deflection regions 53. Note that each of the frame regions 52 is a rectangular writing region determined by the deflection width of a main deflector 16. Each of the sub-deflection regions 53 is a writing region determined by the deflection width of a sub-deflector 15.

Writing data of the entire chip has a data hierarchical structure including a plurality of band-like frame data according to the size of the main deflection region and a plurality of sub-deflection region units smaller than the main deflection region in the frame.

Each of the sub-deflection regions is written by the sub-deflector 15 in such a manner that the electron beam 54 performs deflecting at higher speed than the main deflection region. When the inside of the sub-deflection region is written, the shot having the size and shape prepared according to the shot data is formed by the shaping deflector. Specifically, the electron beam emitted from the electron gun is shaped into a rectangular shape by an aperture 17, and is projected onto an aperture 18 by a shaping deflector 14 to change its beam shape and size. Thereafter, as described above, the electron beam is deflected by the sub-deflector 15 and the main deflector 16, and is irradiated onto the substrate 2 placed on the stage 3.

Positioning of the sub-deflection region is performed by the main deflector 16, and the writing in the sub-deflection region 53 is controlled by the sub-deflector 15. In other words, the electron beam 54 is positioned in the predetermined sub-deflection region 53 by the main deflector 16, and the writing position in the sub-deflection region 53 is determined by the sub-deflector 15. Further, the shape and size of the electron beam 54 are determined by the shaping deflector 14 and the apertures 17 and 18. While the stage 3 is continuously moving in one direction, the inside of the sub-deflection region 53 is written, and when the writing of one sub-deflection region 53 is completed, the next sub-deflection region 53 is written. When the writing of all the sub-deflection regions 53 in the frame region 52 is completed, the stage 3 is moved in a stepwise manner in a direction (e.g., in the Y direction) perpendicular to the direction in which the stage 3 is continuously moved. Thereafter, the same process is repeated to write the frame regions 52 sequentially.

Next, the writing method by the electron beam writing system will be described.

First, the substrate 2 is placed on the stage 3 in the writing chamber 1. Next, the position detection of stage 3 is performed by position circuit 5, and the stage 3 is moved to the writing position by a stage driving circuit 4 based on the signal from the control calculator 27.

The electron beam 54 is emitted from an electron gun 6. A blanking deflector 13 performs an operation of whether or not the electron beam 54 is irradiated onto the substrate 2.

The electron beam 54 passes through the opening portion of the aperture 17, and is deflected by the shaping deflector 14 controlled by a shaping deflection amplifier 34. The electron beam 54 passes through the opening portion provided in the aperture 18 so as to have a beam shape having a variable shape and size. The beam shape is the writing unit of the electron beam 54 irradiated onto the substrate 2.

The electron beam 54 is shaped into a beam shape, and is demagnified by a demagnification lens 11. The irradiating position of the electron beam 54 on the substrate 2 is controlled by the main deflector 16 controlled by a main deflection amplifier 36 and the sub-deflector 15 controlled by a sub-deflection amplifier 35. The main deflector 16 positions the electron beam 54 in each of the sub-deflection regions 53 on the substrate 2. In addition, the sub-deflector 15 positions the electron beam to the writing position in the sub-deflection region 53.

Writing on to the substrate 2 with electron beam 54 is performed by deflecting of the electron beam 54 while stage 3 is moving in one direction. Specifically, while the stage 3 is moving in one direction, the writing of the pattern in each of the sub-deflection regions 53 is performed. After the writing of all the sub-deflection regions 53 in one frame region 52 is completed, the stage 3 is moved to the different frame region 52 to perform the writing in the same manner.

As described above, after the writing of all the frame regions 52 on the substrate 2, the substrate is replaced with a new one to repeat the writing by the same method.

Figure 4:
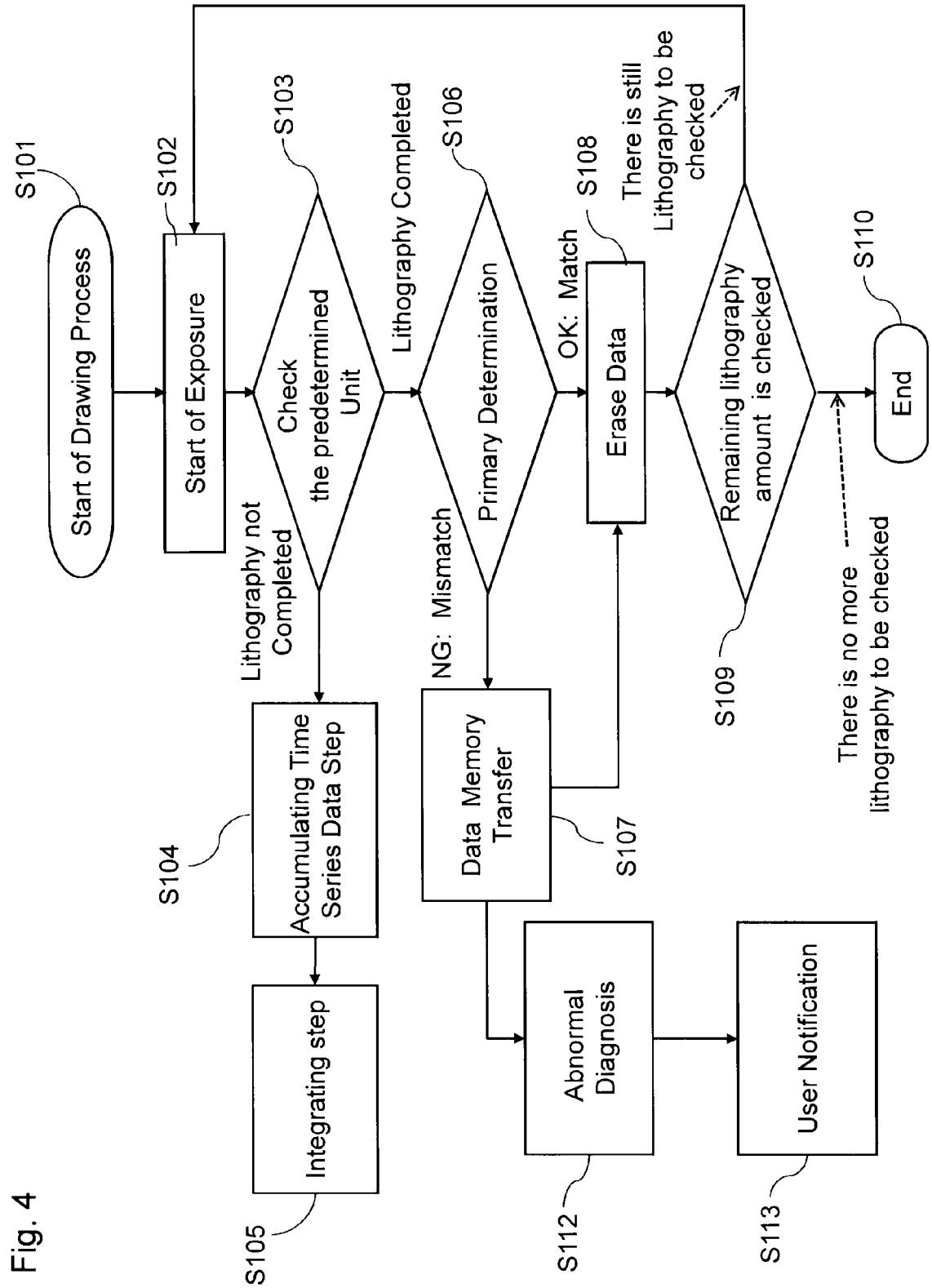
FIG. 4 is a flowchart of the writing method showing abnormality detection and abnormality diagnosis according to the second embodiment.

FIG. 4 is a flowchart of the writing method/abnormality detection/abnormality diagnosis according to the second embodiment.

When the start of the writing process is started by the control calculator 27 of FIG. 2 (S101), the electron beam 54 is irradiated onto the substrate 2 according to the above writing method (S102). Then, the electrons reflected and scattered on the substrate 2 are detected by the detecting unit 19. In S103, it is determined whether or not the writing in the predetermined measurement unit is completed, and when it is not completed, the routine advances to S104. Here, the predetermined measurement unit is defined as, for example, the sub-deflection region unit.

When the writing is within the predetermined measurement unit, the signal from the detecting unit 19 is amplified by the amplifier 20, and is converted to a digital signal by the A/D converter 21 so as to be transmitted to the second storing unit 22b (S104). The second storing unit 22b accumulates the time series data from the detecting unit 19, and transmits the data to the integrating unit 23a during the predetermined measurement unit. The integrating unit 23a integrates the signal from the second storing unit 22b for the predetermined measurement unit (S105).

Although not shown in the flowchart, at the same time, the recording of the time series data of an equivalent value of instructed irradiation amount ($S_N \times t_N$) in accordance to the respecting writing data into the first storing unit 22a and the calculation of the accumulated value are performed.

When it is determined in S103 that the writing within the predetermined measurement unit is completed, the routine advances to S106. In S106, the comparison and determination of the integrated value from the integrating unit and the accumulated value from the computing unit are performed. This process is performed by the comparing unit 24 (primary diagnosis).

In S106, when $\Sigma(S_N \times t_N)$ and $\alpha \Sigma D_N$ do not coincide with each other, that is, when the relation of $\Sigma(S_N \times t_N) = \alpha \Sigma D_N$ ($\alpha$: proportionality coefficient) is not established or when the difference between $\Sigma(S_N \times t_N)$ and $\alpha \Sigma D_N$ is not within the predetermined range, the routine advances to S107, and the information is transmitted to the abnormality diagnosing unit 31 provided in the control calculator 27. In addition, the time series data of the signal ($D_N$) and an equivalent value of instructed irradiation amount stored in the first and second storing units 22a and 22b are transferred to the abnormality diagnosing unit 31. The abnormality diagnosing unit 31 records the information into a magnetic disc or the like for later analysis and inspection. Thereafter, the routine advances to S108 to erase the data primarily stored into the first and second storing units 22a and 22b. When the relation of the above equation is established, on the other hand, the routine advances to S108 to perform the same process.

Upon completing the reception of the time series data (the time series data of the data signal ($D_N$) and an equivalent value of instructed irradiation amount) by the primary abnormality diagnosis, the abnormality diagnosing unit 31 performs abnormality diagnosis such as identification of abnormality location and the estimation and/or identification of abnormality cause to notify the result to the user. Meanwhile, the pattern writing system advances the writing in the next predetermined measurement unit.

Next, in S109, the remaining writing data amount is checked. When there is the writing data amount, the routine is returned to S102 to repeat S102 to S109. When there is not the remaining writing amount in S109, on the other hand, the writing process is completed (S110).

To easily understand the description, the writing and diagnosis flow has been successively shown above. However, during the writing, the diagnosing process such as the transmission of the boundary information of the predetermined measurement unit and the extraction, integration, and comparison of the time series data can be performed simultaneously with the writing.

In a series of processes shown in FIG. 4, S106 is considered to be the primary diagnosis process of an abnormality in the electron beam writing system. The result of the primary diagnosis process is processed by the comparing unit (S106), and when there is an abnormality location, the abnormality diagnosing unit performs the analysis of the time series data and the diagnosis of an abnormal location (S112), and the result is notified to the user (S113). The abnormality is preferably notified to the user immediately after the abnormality diagnosis. And depending on the severity of the abnormality, the writing may be better to be forcibly terminated. For example, when the apparent abnormality of the electron gun (the shutdown and large discharge of the electron gun) is found, forced termination is desired.

An example in which the sub-deflection region is the predetermined measurement unit in the electron beam writing system of the variable shaped beam (VSB) type has been described above. In the actual products, the number of shots included in the sub-deflection region unit (e.g., the region of 16 μm☐) is in a wide range of, for example, about 1 to ten and several hundred, and the time widely ranges between about 50 ns and several ms. Accordingly, in this embodiment, to prevent the signal ($\Sigma D_N$) obtained by the integrating unit 23a from being significantly varied, when the number of shots included in the sub-deflection region is the predetermined number or less, the sub-deflection region is connected to the next adjacent sub-deflection region for grouping so that the total number of shots is the predetermined number or more. For grouping the sub-deflection region to define the predetermined measurement unit, the grouping may be limited so as not to go beyond the next frame, since position identification at the time of abnormality occurrence becomes complicated because the predetermined measurement unit is united across the frames. Likewise, for a different writing method of a raster type writing system, various predetermined measurement units may be defined and may be optimized of abnormality detection. For example, in the raster type electron beam writing system, when the beam size is assumed to be constant, the predetermined number of raster may be defined as the predetermined measurement unit.

Referring to FIG. 5, the abnormality diagnosing method in the abnormality diagnosing unit 31, that is, the comparison of the time series signal from the detecting unit with the time series data from the instructed value computing unit 25' will be described. Further, in this example, N (N: integer) shots are performed in the predetermined measurement unit. Here, the predetermined measurement unit can be, for example, the sub-deflection region unit.

Figure 5A:
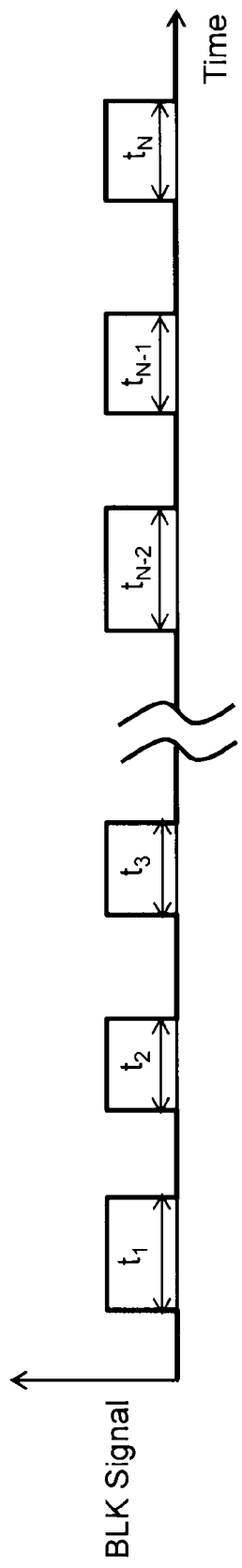
FIG. 5A schematically shows blanking data. The horizontal axis represents time, and the vertical axis represents the intensity of blanking signals (BLK signals).

FIG. 5A schematically shows blanking data. The horizontal axis represents time, and the vertical axis represents the intensity of blanking signals (BLK signals). While the blanking signal is applied, that is, during the time represented by $t_1$, $t_2$, $t_3$, ..., $t_{(N-2)}$, $t_{(N-1)}$, $t_N$, the electron beam is irradiated onto the substrate. Therefore, each of $t_1$, $t_2$, $t_3$, ..., $t_{(N-2)}$, $t_{(N-1)}$, $t_n$ corresponds to the irradiation time of the electron beam per shot. On the other hand, the time in which the blanking signal is not applied corresponds to the settling time, during which the electron beam is not irradiated onto the substrate.

Figure 5B:
FIG. 5B schematically shows the area of each shot.

FIG. 5B schematically shows the area of each shot. Each of $S_1, S_2, S_3, \ldots, S_{(N-2)}, S_{(N-1)}, S_N$ represents the shot area, and corresponds to the unit time instructed irradiation amount equivalent value.

Figure 5C:
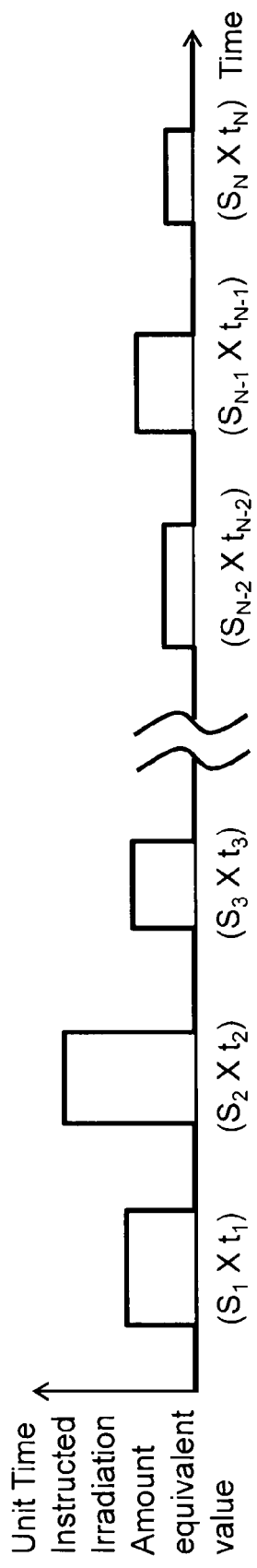
FIG. 5C schematically shows an equivalent value of instructed irradiation amounts.

FIG. 5C schematically shows an equivalent value of instructed irradiation amounts. The horizontal axis represents time, and its scale is the same as FIG. 5A. In addition, the vertical axis represents the unit time instructed irradiation amount equivalent values. Here, an equivalent value of instructed irradiation amount is expressed by the product of the irradiation time of the Nth shot in the predetermined measurement unit and the area of the Nth shot in the predetermined measurement unit. That is, an equivalent value of instructed irradiation amount is expressed by the product of the irradiation time ($t_N$) of the Nth shot shown in FIG. 5A and the area ($S_N$) of the Nth shot shown in FIG. 5B.

Figure 5D:
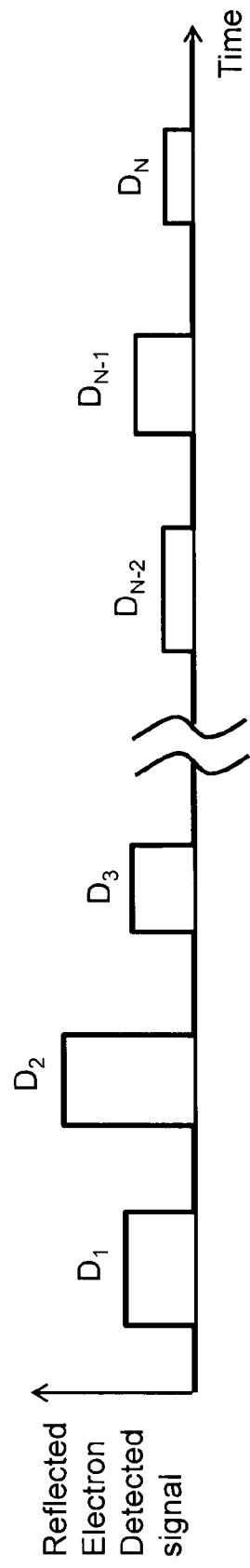
FIG. 5D schematically shows the reflected and scattered electron amounts detected by the detecting unit.

FIG. 5D schematically shows the reflected and scattered electron amounts detected by the detecting unit. The horizontal axis represents time, and its scale is the same as FIG. 5A. In addition, the vertical axis represents the detection signals of the reflected and scattered electrons. Each of $D_1, D_2, D_3, \ldots, D_{(N-2)}, D_{(N-1)}, D_N$ in the drawing represents the reflected and scattered electron signal detected by the corresponding shot. Note that the detection signal may include the signal of other charged particles such as secondary electrons and ions in addition to the reflected and scattered electrons.

In the electron beam writing system 100, the comparing unit 24 compares the signal from the detecting unit with the signal from the irradiation amount computing unit. In this example, the signal ($\Sigma D_N$) from the detecting unit and the data ($\Sigma(S_N \times t_N)$) from the irradiation amount computing unit, obtained by integration by N shots, are compared.

The comparison is specifically the process of checking whether or not the following equation relation is established.

$$\Sigma(S_N \times t_N) = \alpha \Sigma D_N (\alpha: \text{proportionality coefficient})$$

When FIGS. 5C and 5D are compared, the above relation is found to be established. Therefore, in this case, it is determined that the irradiation amount is normal.

Figure 6A:
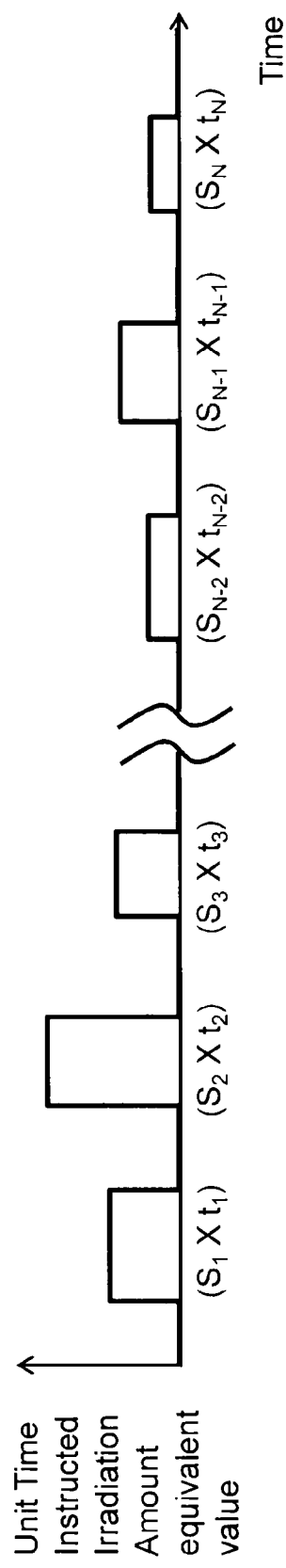
FIG. 6A schematically shows an equivalent value of instructed irradiation amounts.

FIG. 6A schematically shows an equivalent value of instructed irradiation amounts, and is the same as FIG. 5C. Note that, also in this example, N (N: integer) shots are performed in the predetermined measurement unit. The predetermined measurement unit can be, for example, the sub-deflection region unit.

Figure 6B:
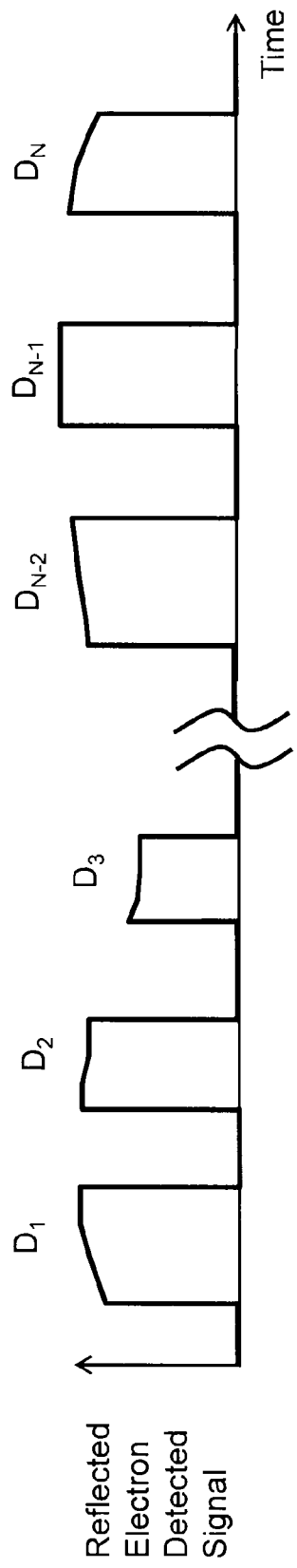
FIG. 6B schematically shows the reflected and scattered electron amounts detected by the detecting unit.

FIG. 6B schematically shows the reflected and scattered electron amounts detected by the detecting unit. The horizontal axis represents time, and its scale is the same as FIG. 6A. In addition, the vertical axis represents the detection signals of the reflected electrons. Further, the detection signal may include the signal of other charged particles such as secondary electrons and ions in addition to the reflected and scattered electrons.

When FIGS. 6A and 6B are compared, the relation of $\Sigma(S_N \times t_N) = \alpha \Sigma D_N$ ($\alpha$: proportionality coefficient) is not established. The reflected electron amounts of FIG. 6B are increased with respect to an equivalent value of instructed irradiation amounts of FIG. 6A. It is determined that abnormality occurs in this predetermined measurement unit, and its related information is transmitted from the comparing unit 24 to the abnormality diagnosing unit 31. In addition, the time series data stored in the first and second storing units 22a and 22b, that is, the data of FIGS. 6A and 6B is transferred to the abnormality diagnosing unit 31. The abnormality diagnosing unit 31 performs abnormality diagnosis including abnormality location identification and abnormal cause estimation based on the information from the comparing unit 24 and the time series data from the first and second storing units 22a and 22b. In the example of FIG. 6B, it is estimated that abnormality occurs in the high voltage power supply in the electron beam writing system 100'. Such diagnosis is notified to the user via the control calculator 27.

FIG. 7A schematically shows an equivalent value of instructed irradiation amounts, and is the same as FIG. 5C. Note that, also in this example, N (N: integer) shots are performed in the predetermined measurement unit. The predetermined measurement unit can be, for example, the sub-deflection region unit.

FIG. 7B schematically shows the reflected electron amounts detected by the detecting unit. The horizontal axis represents time, and its scale is the same as FIG. 7A. In addition, the vertical axis represents the detection signals of the reflected electrons. Further, the detection signal may include the signal of other charged particles such as secondary electrons and ions in addition to the reflected electrons.

When FIGS. 7A and 7B are compared, the relation of $\Sigma(S_N \times t_N) = \alpha \Sigma D_N$ ($\alpha$: proportionality coefficient) is not established. The reflected electron amounts of FIG. 7B are decreased with respect to an equivalent value of instructed irradiation amounts of FIG. 7A. In addition, the reflected and scattered electron amounts are changed in one shot. It is determined that abnormality occurs in this predetermined measurement unit, and its related information is transmitted from the comparing unit 24 to the abnormality diagnosing unit 31. Further, the signals stored in the first and second storing units 22a and 22b, that is, the data of FIG. 7B, are transferred to the abnormality diagnosing unit 31. The abnormality diagnosing unit 31 performs abnormality location identification and abnormality diagnosis based on the information from the comparing unit 24 and the time series data from the first and second storing units 22a and 22b. In the example of FIG. 7B, it is estimated that abnormality occurs in the alignment coil of the electron gun 6 in the electron beam writing system 100' and, as a result, misalignment occurs in the electron beam 54. Such results of diagnosis is notified to the user via the control calculator 27.

Figure 8A:
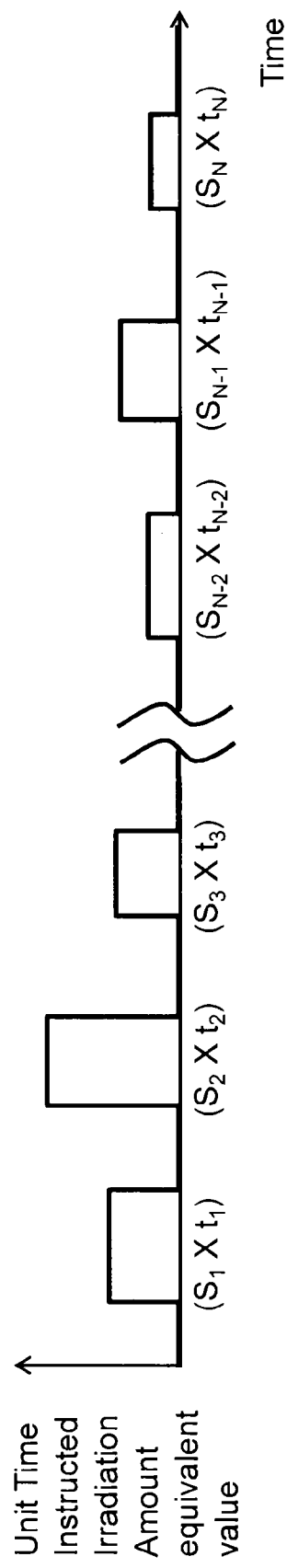
FIG. 8A schematically shows an equivalent value of instructed irradiation amounts.

FIG. 8A schematically shows an equivalent value of instructed irradiation amounts, and is the same as FIG. 5C. Note that, also in this example, N (N: integer) shots are performed in the predetermined measurement unit. The predetermined measurement unit can be, for example, the sub-deflection region unit.

Figure 8B:
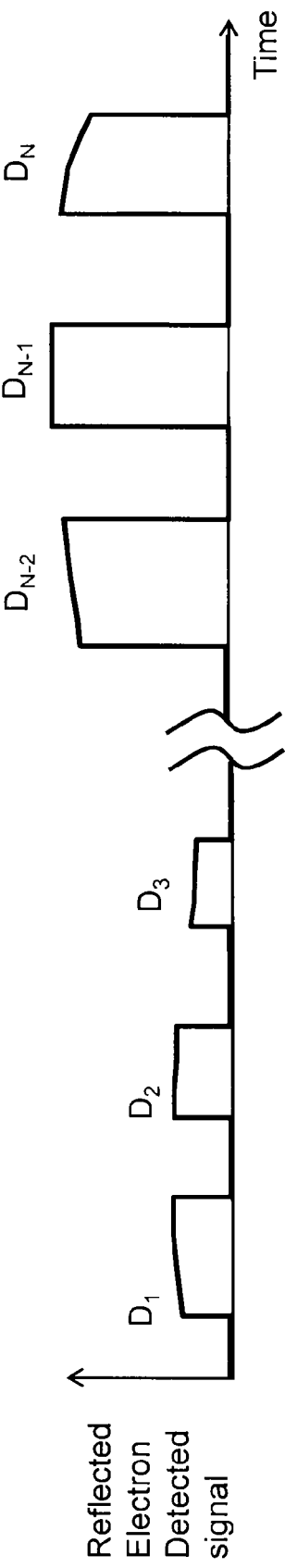
FIG. 8B schematically shows the reflected and scattered electron amounts detected by the detecting unit.

FIG. 8B schematically shows the reflected and scattered electron amounts detected by the detecting unit. The horizontal axis represents time, and its scale is the same as FIG. 8A. In addition, the vertical axis represents the detection signals of the reflected electrons. Further, the detection signal may include the signal of other charged particles such as secondary electrons and ions in addition to the reflected electrons.

When FIGS. 8A and 8B are compared, the relation of $\Sigma(S_N \times t_N) = \alpha \Sigma D_N$ ($\alpha$: proportionality coefficient) is not established. The reflected electron amounts of FIG. 8B are increased or decreased with respect to an equivalent value of instructed irradiation amounts of FIG. 8A. In addition, the reflected electron amounts in one shot are changed. It is determined that abnormality occurs in this predetermined measurement unit, and its related information is transmitted from the comparing unit 24 to the abnormality diagnosing unit 31. Further, the signal stored in the first storing unit 22a, that is, the data of FIG. 8B is also transferred to the abnormality diagnosing unit 31. The abnormality diagnosing unit 31 performs abnormality location identification and abnormality diagnosis based on the information from the comparing unit 24 and the time series data from the first and second storing units 22a and 22b. In the example of FIG. 8B, it is estimated that abnormality such as cathode discharge occurs in the electron gun 6 in the electron beam writing system 100'. Such diagnosis is notified to the user via the control calculator 27. Note that the comparison can be performed by one shot, not by N shots.

FIG. 9A schematically shows an equivalent value of instructed irradiation amounts, and is the same as FIG. 5C. Note that, also in this example, N (N: integer) shots are performed in the predetermined measurement unit. The predetermined measurement unit can be, for example, the sub-deflection region unit.

FIG. 9B schematically shows the reflected electron amounts detected by the detecting unit. The horizontal axis represents time, and its scale is the same as FIG. 9A. In addition, the vertical axis represents the detection signals of the reflected electrons. Note that the detection signal may include the signal of other charged particles such as secondary electrons and ions in addition to the reflected electrons.

When FIGS. 9A and 9B are compared, the relation of $\Sigma(S_N \times t_N) = \alpha \Sigma D_N$ ($\alpha$: proportionality coefficient) is not established. In FIG. 9B, the irradiation time of one shot is longer than that of FIG. 9A. It is determined that abnormality occurs in this predetermined measurement unit, and its related information is transmitted from the comparing unit 24 to the abnormality diagnosing unit 31. In addition, the signal stored in the first storing unit 22a, that is, the data of FIG. 9B is transferred to the abnormality diagnosing unit 31. The abnormality diagnosing unit 31 performs abnormality location identification and abnormality diagnosis based on the information from the comparing unit 24 and the time series data from the first and second storing units 22a and 22b. In the example of FIG. 9B, it is estimated that abnormality occurs in a blanking amplifier 33 in the electron beam writing system 100' and, as a result, blanking control abnormality occurs. Such diagnosis is notified to the user via the control calculator 27.

As described above, in the present invention, the reflected electrons generated by irradiating the electron beam onto the substrate are detected by the detecting unit. On the other hand, the product of the area ($S_N$) and the irradiation time ($t_N$) of the Nth shot in the predetermined measurement unit, which are obtained from the writing data, is computed by the instructed value computing unit. Then, the first storing unit stores the time series data of $S_N$ including the shot start and end time. On the other hand, the time series data of the signal ($D_N$) from the detecting unit is stored in the second storing unit.

Then, the integrating unit integrates the signal ($D_N$) from the detecting unit in the predetermined measurement unit to calculate an integrated value.

Then, the comparing unit compares the integrated value with an equivalent value of instructed irradiation amount (accumulated value) in the predetermined measurement unit to determine whether or not abnormality occurs in the detected amount of reflection and scattering. Thereafter, an abnormality location is diagnosed by the abnormality diagnosing unit based on the information from the comparing unit and the time series data from the second storing unit. That is, according to the present invention, the abnormality location and cause can be diagnosed in the system substantially in real time. In addition, when the predetermined measurement unit is the sub-deflection region scanned with the energy beam by the sub-deflector, the process of abnormality diagnosis or the like becomes easy so that abnormality in the system can be accurately and efficiently detected.

The features and advantages of the present invention may be summarized as follows:

According to an aspect of the present invention, a pattern writing system and a pattern writing method, which detects irradiation amount abnormality during the pattern writing process in real time are provided.

In addition, according to another aspect of the present invention, a pattern writing system abnormality diagnosing method, which diagnoses the pattern writing system for irradiation amount abnormality including abnormality cause estimation is provided.

Further, the present invention is not limited to the above embodiments and various modifications can be made in the scope without departing from the purport of the present invention. For example, although the electron beam is used in the above embodiments, the present invention is not limited to this. The present invention is applicable when other charged particle beam such as an ion beam and other energy beam such as a light beam, for example, a laser light are used.

For example, the laser light writing system has a configuration mechanically different from the electron beam writing system in such a manner that a mirror is used for laser beam scanning and movement and a light amount detector is used for detecting reflected and scattered light. However, also in this case, reflected and scattered light from the substrate is detected to compare the light with and an equivalent value of instructed irradiation amount in the predetermined measurement unit, so that writing abnormality determination and diagnosis can be performed.

What is claimed is:

1. A pattern writing system configured to emit an energy beam onto a substrate that is divided into a plurality of frame regions based on writing data, the frame regions having a width which an energy beam can be deflected to by a main deflector; and a plurality of sub-deflection regions can be deflected to by a sub-deflector to write a pattern on the substrate, comprising:
   a detecting unit which detects reflected and scattered charged particles or reflected and scattered light generated by emitting the energy beam onto the substrate;
   a computing unit which computes a first value, the first value being an equivalent value of an instructed irradiation amount of a frame region, using the writing data;
   an integrating unit which integrates a signal from the detecting unit of the frame region to obtain a second value; and
   a comparing unit which compares the first value from the computing unit with the second value from the integrating unit;
   wherein the comparing unit compares the first value from the computing unit with a third value, the third value obtained by multiplying the second value from the integrating unit, by a predetermined coefficient of the frame region, and when the difference between the first and third values is at a predetermined threshold value or less, the comparing unit determines that an actual irradiation amount of the energy beam is normal, and when the difference between the first and third values is larger than the predetermined threshold value, the comparing unit determines that the actual irradiation amount of the energy beam is abnormal, and indicates the abnormality.

2. A pattern writing system which emits an energy beam onto a substrate to write a predetermined pattern based on writing data onto the substrate, comprising:
   a detecting unit which detects reflected and scattered charged particles or reflected and scattered light generated by emitting the energy beam onto the substrate;

a computing unit which computes a first value, the first value being an equivalent value of an instructed irradiation amount in a predetermined measurement unit, using the writing data;

an integrating unit which integrates a signal from the detecting unit in the predetermined measurement unit to obtain a second value;

a comparing unit which compares the first value from the computing unit with the second value from the integrating unit;

a first storing unit which stores time series data of a shot irradiation, the shot irradiation being an equivalent value of the instructed irradiation amount for each shot computed using the writing data;

a second storing unit which stores a time series signal from the detecting unit; and an abnormality diagnosing unit which is configured to compare and diagnose the time series data of shot irradiation and the time series signal.

3. A pattern writing method of a pattern writing system which emits an energy beam onto a substrate to write a pattern based on writing data onto the substrate, comprising the steps of:

detecting reflected and scattered charged particles or reflected and scattered light generated by emitting the energy beam onto the substrate;

computing a first value, the first value being an equivalent value of instructed irradiation amount in a predetermined measurement unit, using the writing data;

integrating a signal from the detecting step in the predetermined measurement unit to obtain a second value; and comparing the first value obtained in the computing step with the second value obtained in the integrating step to determine abnormality, wherein, when it is determined that abnormality occurs in the comparing step, information in the comparing step is accumulated to perform an abnormality diagnosis.

4. An abnormality diagnosing method of a pattern writing system which emits an energy beam onto a substrate to write a predetermined pattern using writing data onto the substrate, comprising the steps of:

detecting reflected and scattered charged particles or reflected and scattered light generated by emitting the energy beam onto the substrate;

computing a first value, said first value being an equivalent value of an instructed irradiation amount in a predetermined measurement unit, using the writing data;

integrating a signal obtained from the detecting step in the predetermined measurement unit to obtain a second value;

comparing the first value from the computing step with the second value from the integrating step;

storing time series data of shot irradiation to a first storing unit, a shot irradiation being equivalent to the instructing irradiation amount for each shot calculated using the writing data; and storing a time series signal from the detecting unit to a second storing unit, wherein, when it is determined that abnormality occurs in the comparing step, the time series data of shot irradiation in the first storing unit and the time series signal in the second storing unit are compared to estimate the cause of the abnormality.

* * * * *